US009806682B1

(12) United States Patent
Marcone et al.

(10) Patent No.: US 9,806,682 B1
(45) Date of Patent: Oct. 31, 2017

(54) MULTILEVEL CLASS-D AMPLIFIERS

(71) Applicant: Marvell International Ltd., Hamilton (BM)

(72) Inventors: Bruno Marcone, Mezzanino (IT); Francesco Rezzi, Cava Manara (IT)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/049,534

(22) Filed: Feb. 22, 2016

Related U.S. Application Data

(60) Provisional application No. 62/120,172, filed on Feb. 24, 2015.

(51) Int. Cl.
| | |
|---|---|
| *H03F 3/38* | (2006.01) |
| *H03F 3/217* | (2006.01) |
| *H03F 3/213* | (2006.01) |
| *H03F 3/185* | (2006.01) |

(52) U.S. Cl.
CPC .......... *H03F 3/2171* (2013.01); *H03F 3/185* (2013.01); *H03F 3/213* (2013.01); *H03F 2200/351* (2013.01); *H03F 2200/48* (2013.01)

(58) Field of Classification Search
CPC ..... H03F 1/02; H03F 3/16; H03F 3/19; H03F 3/24; H03F 3/211; H03F 3/217; H03F 3/2171; H03F 3/2173; H03F 3/245; H03F 3/45479; H03F 2200/03; H03F 2200/331; H03F 2200/451; H03F 2203/45078; H03F 2203/45441; H03K 3/012; H03K 5/12; H03H 11/1217; H04L 27/2053; H02P 6/006; H02P 6/182; H02P 23/0036; H04R 1/1083; H04R 3/00; H04R 5/04; H04R 2460/01; G01B 33/023; G01B 3/016; G01B 3/0416; Y10T 29/49002
USPC ........... 330/9, 10, 51, 124 R, 207, 251, 277, 330/277 A; 332/109; 375/238; 323/284; 324/655; 327/110, 552, 568; 381/120
See application file for complete search history.

(56) References Cited

U.S. PATENT DOCUMENTS

| | | | | |
|---|---|---|---|---|
| 2009/0116654 | A1* | 5/2009 | Hansen | H03F 3/211 381/28 |
| 2009/0146737 | A1* | 6/2009 | Guo | H03F 3/217 330/251 |
| 2010/0038972 | A1* | 2/2010 | Buter | H03F 3/217 307/110 |
| 2013/0127530 | A1* | 5/2013 | Ni | H03F 3/217 330/251 |
| 2015/0091644 | A1* | 4/2015 | Li | H03F 3/217 330/251 |
| 2015/0288335 | A1* | 10/2015 | Hoyerby | H03F 3/217 330/251 |

OTHER PUBLICATIONS

Wan, Multi-level switch mode class D amplifier, Department of Electrical and Computer Engineering, The University of Queensland, Australia, Oct. 1998, pp. 24-30.*

(Continued)

*Primary Examiner* — Steven J Mottola
*Assistant Examiner* — Hafizur Rahman

(57) ABSTRACT

Implementations of a class-D amplifier can be used to amplify an input analog signal and provide to a load a multilevel amplified signal having an amplitude larger than a voltage level of a power source used by the class-D amplifier.

15 Claims, 10 Drawing Sheets

(56) References Cited

OTHER PUBLICATIONS

Palumbo et al., "Charge Pump Circuits: An Overview on Design Strategies and Topologies", IEEE Circuits and Systems Magazie, First Quarter 2010, pp. 31-45.
Class-D amplifier, Wikipedia, https://en.wikipedia.org/wiki/Class-D_amplifier, Aug. 18, 2015, 5 pages.
Honda et al., "IRAUDAMP7S 25W-500W Scalable Output Power Class D Audio Power Amplifier Reference Design Using the IRS2092S Protected Digital Audio Driver", International Rectifier, Reference Design, IRAUDAMP7S Rev 1.3, Aug. 29, 2008, 42 pages.
Texas Instruments, "LM2731 0.6/1.6 MHz Boost Converters With 22V Internal FET Switch in SOT-23", Product Folder Links: LM2731, SNVS217F, May 2004.
Moreno et al., "Class-D Amplifiers—Theory and Design", http://sound.westhost.com/articles/pwm.htm, Elliott Sound Products, Jun. 4, 2005. 10 pages.

\* cited by examiner

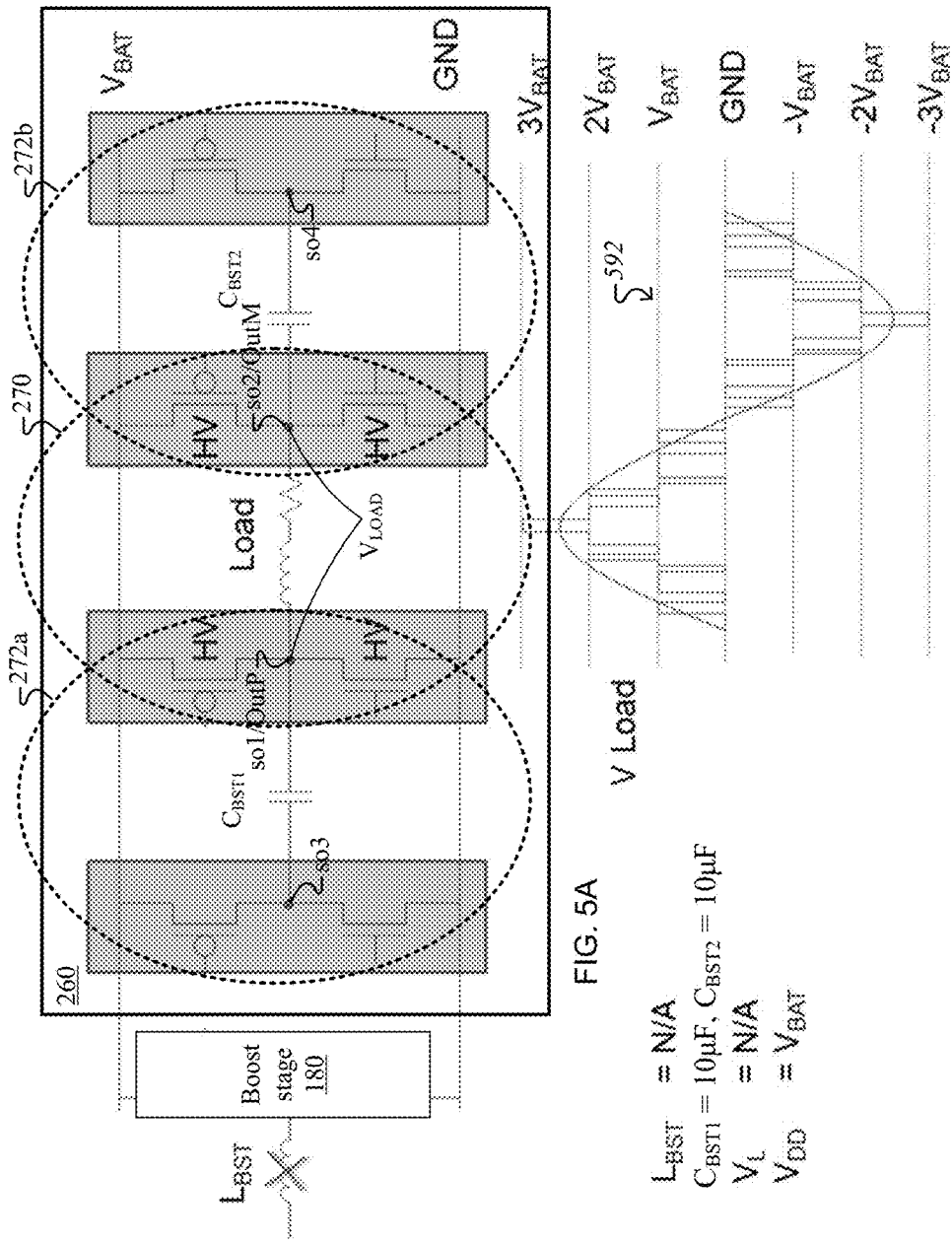

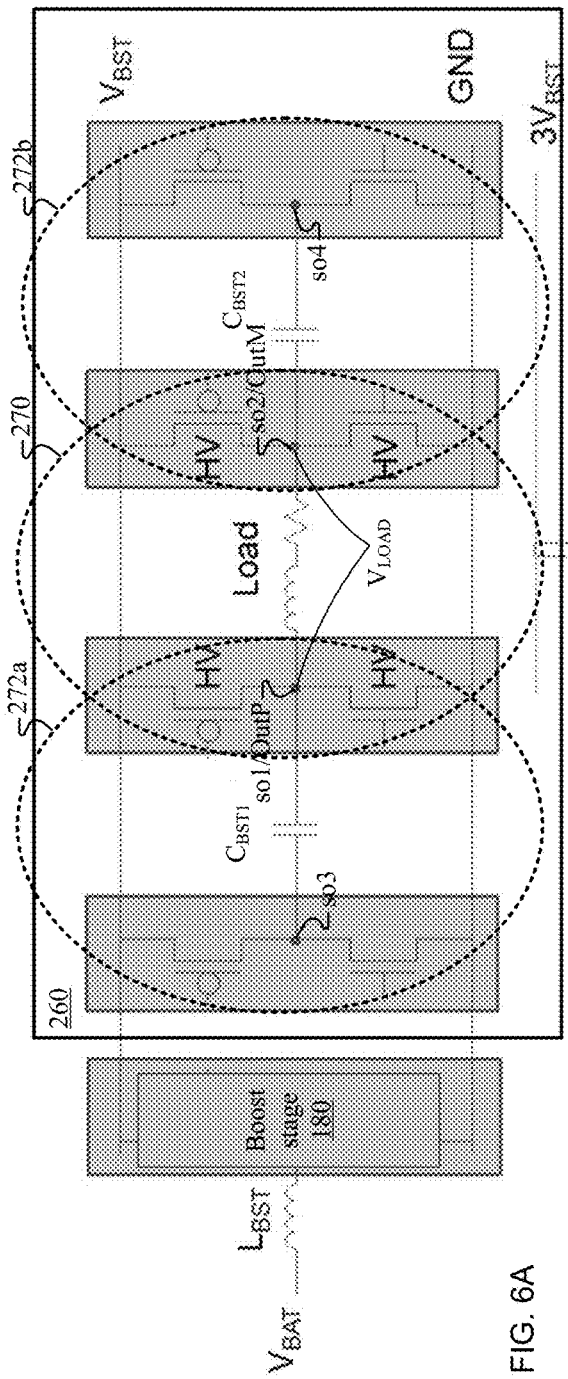
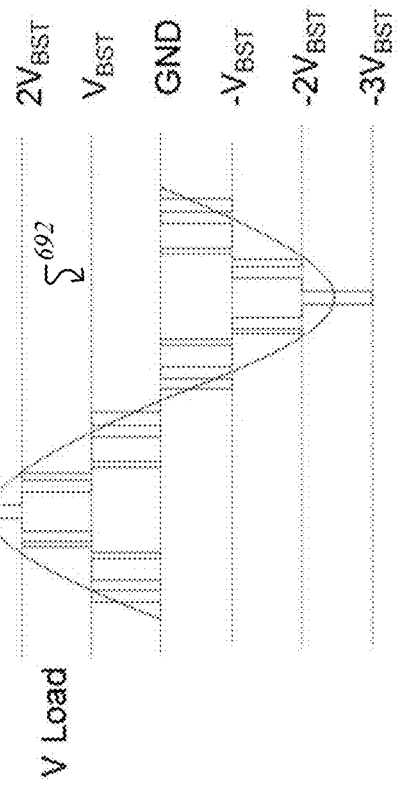
$L_{BST} = 2\mu H$
$C_{BST1} = 10\mu F, C_{BST2} = 10\mu F$
$V_L = V_{BAT}$
$V_{DD} = V_{BST}$
FIG. 6A
FIG. 6B

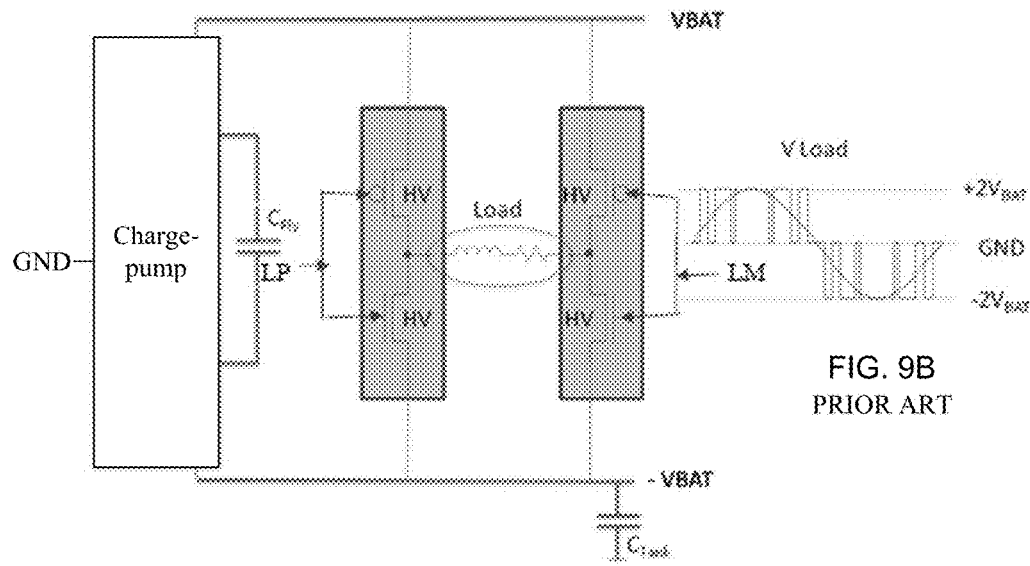
FIG. 9A
PRIOR ART
FIG. 9B
PRIOR ART
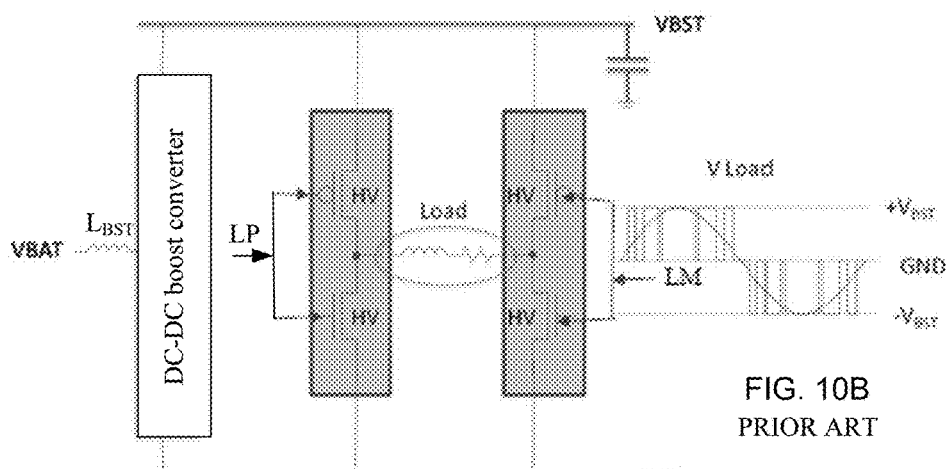
FIG. 10A
PRIOR ART
FIG. 10B
PRIOR ART

MULTILEVEL CLASS-D AMPLIFIERS

CROSS-REFERENCE TO RELATED APPLICATIONS

This disclosure claims priority to U.S. Provisional Application Ser. No. 62/120,172, filed Feb. 24, 2015, the disclosure of which is incorporated herein by reference in its entirety.

BACKGROUND

The present disclosure is generally related to class-D amplifiers, and more specifically to multilevel class-D amplifiers.

A class-D amplifier, also known as a switching amplifier, includes amplifying devices (e.g., field-effect transistors (FETs), metal-oxide FETs (MOSFETs), power MOSFETs) that are implemented as electronic switches, instead of as linear gain devices, as in linear amplifiers. A class-D amplifier includes an input stage that uses, e.g., pulse-width modulation (PWM), to convert an input analog signal (to be amplified by the class-D amplifier) to a train of constant amplitude pulses having a variable duty cycle that is proportional to instantaneous values of the input analog signal. The train of pulses, also referred to as a PWM signal, is indicative of the input signal. The class-D amplifier further includes an output stage that uses two pairs of high-voltage switches (e.g., power MOSFETs) which are driven by respective instances of the PWM signal and, when a load is coupled to output ports of the output stage, are arranged to form an output bridge. In this manner, the output stage delivers a constantly changing voltage into the coupled load as an amplified signal, which is an amplified replica of the PWM signal provided by the input stage. A low-pass filter can remove high-frequency switching components of the amplified signal to recover information carried by the input analog signal, where the recovered information is to be used by the load. Note that, although the class-D amplifier uses a source of DC power, e.g., a battery that outputs a voltage level $V_{BAT}$ (e.g., $V_{BAT}=3.7V$), the amplification process itself operates by switching.

Moreover, boosting technologies can be implemented in conjunction with the output stage to increase a level of the foregoing amplified signal above $V_{BAT}$. FIG. 9A shows an output stage of a class-D amplifier implemented in a conventional charge-pump configuration. Here, the output stage is driven by two PWM signals (LP and LM) indicative of an input analog signal, and uses a charge-pump circuit, powered by a voltage level $V_{BAT}$, in conjunction with a fly capacitor $C_{Fly}$ and a tank capacitor $C_{Tank}$. In this manner, the output bridge of the output stage is powered by a larger voltage level $2V_{BAT}$ output by the charge-pump circuit. Hence, an amplified signal $V_{Load}$, provided to the load by the output stage implemented in the charge-pump configuration, is a train of pulses having constant amplitude $2V_{BAT}=7.4V>V_{BAT}$, as shown in FIG. 9B. FIG. 10A shows an output stage of a class-D amplifier implemented in a conventional DC-DC boosted configuration. Here, the output stage also is driven by two PWM signals (LP and LM) indicative of an input analog signal, but uses a DC-DC boost converter, powered by a voltage level $V_{BAT}$ through a boost inductor $L_{BST}$. In this manner, the output bridge of the output stage is powered by a larger voltage level $V_{BST}$ output by the DC-DC boost converter, where $V_{BST}>V_{BAT}$ (because, e.g., $V_{BST}=5.5V$). Hence, an amplified signal $V_{Load}$ provided to the load, by the output stage implemented in the DC-DC boosted configuration, is a train of pulses having constant amplitude $V_{BST}$, as shown in FIG. 10B.

A conventional combination of the charge-pump configuration and the DC-DC boosted configuration of the class-D amplifier can be implemented, in which a DC-DC boost converter powered by $V_{BAT}$ through a boost inductor $L_{BST}$ powers the charge-pump circuitry and causes the latter to output a voltage $2V_{BAT}=11V$. Here, an amplified signal $V_{Load}$ provided to the load, by the output stage implemented as a combination of charge-pump configuration and DC-DC boosted configuration, is a train of pulses having constant amplitude $2V_{BST}$. Note, however, that the amplified signal $V_{Load}$ (e.g., illustrated either in FIG. 9B or FIG. 10B) provided to the load by the output stage, in either of the conventional configurations shown in FIG. 9A or FIG. 10A or in the noted conventional combination thereof, is always a single-level amplified signal.

SUMMARY

In this specification, implementations of a class-D amplifier are described that can be used to amplify an input analog signal and provide to a load a multilevel amplified signal having an amplitude larger than a voltage level of a power source used by the class-D amplifier.

One aspect of the disclosure can be implemented as an amplifier system for amplifying an input signal that varies over time. The amplifier system includes a multilevel output stage powered with a voltage having a predetermined voltage level relative to ground; a multilevel modulator configured to form a plurality of pulse-width modulated (PWM) driving signals based on i) the input signal and ii) a square carrier signal. Additionally, the multilevel modulator is further configured to drive the multilevel output stage with the plurality of PWM driving signals. The amplifier system further includes a pair of output ports coupled with the multilevel output stage; and a boost capacitor coupled with a first output port of the pair of output ports. The multilevel output stage is configured to output, at the pair of output ports, when driven with the plurality of PWM driving signals, an output signal having a plurality of levels. Here, differences between adjacent levels of the output signal have a magnitude equal to the predetermined voltage level, an amplitude of the output signal is a non-unity integer multiple of the predetermined voltage level, and the output signal varies over time between its multiple levels in accordance with the input signal.

Implementations can include one or more of the following features. In some implementations, the multilevel output stage can include four high-voltage (HV) switches, which form, when a load is coupled between the pair of output ports, an output bridge that includes the four HV switches and the load; and a boost bridge that includes a pair of the HV switches, a pair of low-voltage (LV) switches, and the boost capacitor. Here, the boost bridge is driven by a pair of PWM driving signals of the plurality of PWM driving signals. In some of these cases, the amplitude of the output signal can be twice the predetermined voltage level.

In some of the foregoing implementations, the multilevel output stage further can include a second boost capacitor coupled with a second output port of the pair of output ports; and a second boost bridge that includes a second pair of the HV switches, a second pair of LV switches, and the second boost capacitor. Here, the second boost bridge is driven by a second pair of PWM driving signals of the plurality of PWM driving signals. In some of these cases, the amplitude of the output signal can be three times the predetermined voltage level. In some cases, the amplifier system can include a power supply that provides the predetermined voltage level to the multilevel output stage. In other cases, when the multilevel output stage further includes a boost stage, the amplifier system can include a power supply that powers the boost stage through a boost inductor with a power supply voltage level smaller than the power supply voltage level, and causes the boost stage to provide the predetermined voltage level to the first and second boost bridges.

In some implementations, the multilevel modulator can include a fully differential integrator. Here, the multilevel modulator can include a differential input to receive the input signal. Also here, the multilevel modulator can include four outputs through which respective four PWM driving signals are delivered to the multilevel output stage.

Another aspect of the disclosure can be implemented as an integrated circuit chip including amplifier circuitry. The amplifier circuitry includes (I) a multilevel modulator including (i) two modulator input ports, and (ii) four modulator output ports; and (II) a multilevel output stage including (i) four output stage input ports respectively coupled with the four modulator output ports, (ii) four output stage boost ports, (iii) a first pair of high-voltage (HV) switches connected to each other at a first one of the output stage boost ports, the first pair of HV switches having a first control terminal coupled to a first one of the output stage input ports, (iv) a second pair of HV switches connected to each other at a second one of the output stage boost ports, the second pair of HV switches having a second control terminal coupled to a second one of the output stage input ports, (v) a first pair of low-voltage (LV) switches connected to each other at a third one of the output stage boost ports, the first pair of LV switches having a third control terminal coupled to a third one of the output stage input ports, and (vi) a second pair of LV switches connected to each other at a fourth one of the output stage boost ports, the second pair of LV switches having a fourth control terminal coupled to a fourth one of the output stage input ports.

Implementations can include one or more of the following features. In some implementations, an amplification system can include the foregoing integrated circuit chip including amplifier circuitry. In addition, the amplification system further can include two amplifier input ports respectively coupled with the modulator input ports; and two amplifier output ports respectively coupled with the first output stage boost port and the second output stage boost port. Here, during operation of the amplifier system, a load coupled between the two amplifier output ports causes formation of an output bridge that includes the first pair of HV switches, the second pair of HV switches and the load.

In some implementations, the amplifier system can include a boost capacitor having two terminals, one of the two terminals being coupled to the first output stage boost port, and another of the two terminals being coupled to the third output stage boost port, thereby forming a boost bridge that includes the first pair of HV switches, the first pair of LV switches and the boost capacitor. Here, the amplifier system can further include a second boost capacitor having two terminals, one of the two terminals of the second boost capacitor being coupled to the second output stage boost port and at the other one of the terminals of the second boost capacitor being coupled to the fourth output stage boost port, thereby forming a second boost bridge that includes the second pair of HV switches, the second pair of LV switches and the second boost capacitor. For some cases, the amplifier system can further include a power supply to power the multilevel output stage with a predetermined voltage level. In other cases, when the multilevel output stage includes a boost stage including a boost stage input and a boost stage output, the amplification system can further include a boost inductor coupled with the boost stage input; and a power supply to power the boost stage through the boost inductor with a power supply voltage level. In the latter cases, the boost stage can power the multilevel output stage with a predetermined voltage level that is boosted relative to the power supply voltage level.

In some implementations, the multilevel modulator can include a fully differential integrator. Here, the multilevel modulator is configured perform, during operation of the integrated circuit chip including amplifier circuitry, operations including: (I) receive an input signal through the modulator input ports, (II) form four pulse-width modulated (PWM) drive signals based on (i) the input signal and (ii) a square carrier signal, and (III) provide the four PWM drive signals, through respective modulator output ports to respective output stage input ports, to drive the output stage.

The disclosed technologies can result in one or more of the following potential advantages. An input stage and an output stage of the disclosed class-D amplifier, the latter stage including a boost stage to be activated through a boost inductor, can be formed on an integrated circuit (IC) chip, and the IC chip can be used in an amplification system configurable in accordance with specific use cases. For example, the IC chip can be used, as is (i.e., without connecting one or two boost capacitors to select pairs of outputs of the output stage, and without connecting the boost inductor to the boost stage), in an amplification system configured to amplify audio signals in a low end consumer electronics device, e.g., an inexpensive smartphone, to provide to its speaker (or to earphones plugged to its audio jack) amplified signals with an amplitude up to a voltage level (e.g., $V_{BAT}$=3.7V) of a power source used by the IC chip. In this case, the power delivered into an 8Ω load is about 0.5 W. As another example, one or two boost capacitors can be connected to select one or two pairs of output ports of the IC chip (but without connecting the boost inductor to the boost stage) as part of the amplification system configured to amplify audio signals in a mid-level consumer electronics device, e.g., a mid-range priced smartphone, to provide to its speaker (or to earphones plugged to its audio jack) amplified signals with an amplitude up to respectively twice or three times the voltage level (e.g., $2V_{BAT}$=7.4V or $3V_{BAT}$=11.1V) of a power source used by the IC chip. In these cases, the power delivered into an 8Ω load is about 2 W or 4 W, respectively. As yet another example, one or two boost capacitors can be connected to select pairs of output ports of the IC chip, and the boost inductor can be connected to the boost stage as part of the amplification system configured to amplify audio signals in a high end consumer electronics device, e.g., an expensive smartphone, to provide to its speaker (or to earphones plugged to its audio jack) amplified signals with an amplitude up to three times the voltage level (e.g., $3V_{BST}$=16.5V) output by the boost stage. In this case, the power delivered into an 8Ω load is about 8 W. This kind of use case configurability of the disclosed class-D amplifier is possible neither in the charge-pump implementation of the class-D amplifier shown in FIG. 9A, where the fly capacitor $C_{Fly}$ and the tank capacitor $C_{Tank}$ must be part of the amplifier system, nor in the DC-DC boosted configuration of the class-D amplifier shown in FIG. 10A, where the boost inductor $L_{BST}$ must be part of the amplifier system.

Further, some of the disclosed implementations of the class-D amplifier that do not require for a boost inductor to be part of the disclosed amplifier system can output an amplified signal having an amplitude $3V_{BAT}$=11.1V that is comparable to the amplitude $2V_{BST}$=11V of an amplified signal output by the above-noted conventional combination of the configurations shown in FIG. 9A or FIG. 10A, which often requires a boost inductor $L_{BST}$ to be part of the latter conventional amplifier system. In this manner, the disclosed amplifier system can be less voluminous than, while delivering the same performance as, the foregoing conventional amplifier system.

Furthermore, an area of silicon required for the smaller, LV switches included in the boost stage of the IC chip of the disclosed class-D amplifier is smaller than an area of silicon required for the larger, HV switches included in the DC-DC boost convertor of the IC chip of the conventional class-D amplifier illustrated in FIG. 10A. Thus, the IC chip of the disclosed class-D amplifier is less voluminous and consumes less power than the IC chip of the conventional class-D amplifier illustrated in FIG. 10A.

In addition, the multilevel output stage of the disclosed amplifier system has smaller output resistance $R_{OUT}$ than the output resistance $R_{OUT,CP}$ of the single-level output stage of the conventional charge-pump implementation of the class-D amplifier shown in FIG. 9A, and thus the disclosed amplifier system can transfer power more efficiently to a load than the noted conventional amplifier system.

Another benefit of using a multilevel output stage for the disclosed amplifier system is that the amplitude of the amplified signal output by the disclosed class-D amplifier varies in steps equal to a voltage level (e.g., $V_{BAT}$) of a power source used by the IC chip. In contrast, the conventional charge-pump implementation of the class-D amplifier illustrated in FIG. 9A uses a single-level output stage, and thus, the amplitude of the amplified signal output by the conventional charge-pump implementation of the class-D amplifier varies in steps equal to twice the voltage level $V_{BAT}$ (as shown in FIG. 9B). The small changes $V_{BAT}$ (e.g., 3.7V) in amplitude of the amplified signal output by the disclosed amplifier system cause smaller electromagnetic interference (EMI) noise than the EMI noise caused by large changes $2V_{BAT}$ (e.g., 7.4V) in amplitude of the amplified signal output by conventional charge-pump amplifier systems.

Details of one or more implementations of the disclosed technologies are set forth in the accompanying drawings and the description below. Other features, aspects, descriptions and potential advantages will become apparent from the description, the drawings and the claims.

BRIEF DESCRIPTION OF THE DRAWINGS

FIGS. 5A-5B show aspects of a multilevel output stage that provides a multilevel output signal with an amplitude equal to three times a power supply voltage.

FIGS. 6A-6B show aspects of a multilevel output stage that provides a multilevel output signal with an amplitude equal to three times a boosted power supply voltage.

FIGS. 9A-9B show aspects of a conventional charge-pump implementation of an output stage of a class D amplifier.

FIGS. 10A-10B show aspects of a conventional DC-DC boosted implementation of an output stage of a class D amplifier.

Certain illustrative aspects of the systems, apparatuses, and methods according to the disclosed technologies are described herein in connection with the following description and the accompanying figures. These aspects are, however, indicative of but a few of the various ways in which the principles of the disclosed technologies may be employed and the disclosed technologies are intended to include all such aspects and their equivalents. Other advantages and novel features of the disclosed technologies may become apparent from the following detailed description when considered in conjunction with the figures.

DETAILED DESCRIPTION

Figure 1A:
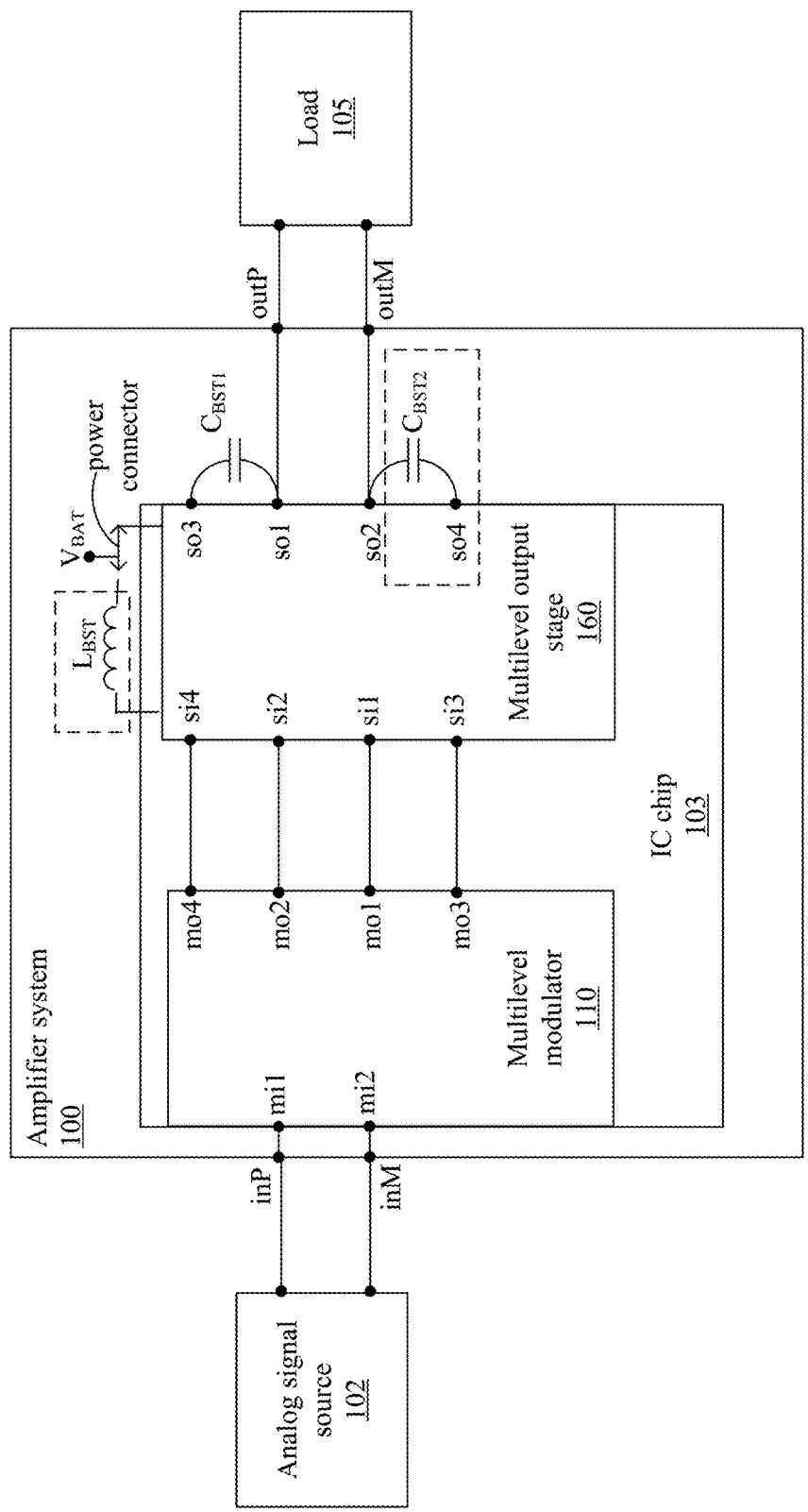
FIGS. 1A-1D show aspects of a multilevel class D amplifier that includes a multilevel modulator and a multilevel output stage.

FIGS. 1A-1D show aspects of a multilevel class D amplifier 100, also referred to as an amplifier system or amplification system, that includes a multilevel modulator 110 and a multilevel output stage 160. FIG. 1A shows an example of an implementation of the amplifier system 100 in which the multilevel modulator 110 and the multilevel output stage 160 are part of the same IC chip 103. In other implementations, the multilevel modulator 110 is part of a first IC chip and the multilevel output stage 160 is part of a second, different IC chip. Further, the amplifier system 100 includes a pair of input ports (inP, inM) to receive an input analog signal, when an analog signal source 102 is coupled to the input ports. Note that the input analog signal can be an audio signal having frequency components in the audio frequency range [200 Hz, 20 kHz], or can be an analog signal having frequency components in other frequency ranges (e.g., lower than, overlapping or higher than the audio frequency range). Furthermore, the amplifier system 100 includes a pair of output ports (outP, outM) to provide an amplified signal, when a load 105 is coupled to the output ports. Here, the amplified signal is an amplified replica of the input analog signal received from the signal source 102.

The multilevel modulator 110 includes a pair of modulator input ports (mi1, mi2) that are respectively coupled to the input ports (inP, inM) of the amplifier system 100. Additionally, the multilevel modulator 110 includes four modulator output ports (mo1, mo2, mo3, mo4). The multilevel output stage 160 includes four output stage input ports (si1, si3, si2, si4) respectively coupled to the four modulator output ports (mo1, mo2, mo3, mo4). Also, the multilevel output stage 160 includes four output stage boost ports (so1, so3, so2, so4). Here, a first pair (so1, so2) of the output stage boost ports (so1, so3, so2, so4) is coupled to the output ports (outP, outM) of the amplifier system 100.

In some implementations, a terminal of a power supply associated with the amplifier system 100 that is biased with a voltage level $V_{BAT}$ is coupled directly with the multilevel output stage 160 through a power connector. In other implementations, the terminal of the power supply that is biased with the voltage lever $V_{BAT}$ is coupled with the multilevel output stage 160 through a boost inductor $L_{BST}$ of the amplifier system 100. Here, the power supply can be a battery and a value of the voltage level can be $V_{BAT}$=3.7V. It should be noted that the mechanisms described herein apply equally to other types of power supplies and/or other voltage levels.

In addition, the amplifier system 100 can include a boost capacitor $C_{BST1}$ having two terminals, where one of the two terminals is coupled to the first output stage boost port so1—that also is coupled to the first output port outP, and another of the two terminals is coupled to the third output stage boost port so3. In this boosted implementation of the amplifier system 100, the predetermined voltage level $V_{BAT}$ is provided by the power supply directly to the multilevel output stage 160, as described below in connection with FIGS. 4A-4B. Note that the boost capacitor $C_{BST1}$ and the power supply can be connected to the multilevel output stage 160 in the foregoing manner during fabrication of the amplifier system 100, e.g., to satisfy specifications of a low-to-mid-priced consumer electronics device in which this boosted amplifier system will be integrated.

Further, the amplifier system 100 can include a second boost capacitor $C_{BST2}$ in addition to the boost capacitor $C_{BST1}$. The second boost capacitor $C_{BST2}$ also has two terminals, where one of the two terminals is coupled to the second output stage boost port so2, which is coupled to the second output port outM, and another of the two terminals is coupled to the fourth output stage boost port so4. In this double-boosted implementation of the amplifier system 100, the predetermined voltage level $V_{BAT}$ is provided by the power supply directly to the multilevel output stage 160, as described below in connection with FIGS. 5A-5B. Note that the boost capacitor $C_{BST1}$, the second boost capacitor $C_{BST2}$ and the power supply can be connected to the multilevel output stage 160 in the foregoing manner during fabrication of the amplifier system 100, e.g., to satisfy specifications of a mid-to-high-priced consumer electronics device in which this double-boosted amplifier system will be integrated.

Moreover, a highly boosted implementation of the amplifier system 100 once again includes the boost capacitor $C_{BST1}$ coupled between the first output stage boost port so1 and the third output stage boost port so3 and the second boost capacitor $C_{BST2}$ coupled between the second output stage boost port so2 and the fourth output stage boost port so4. However, in the highly boosted implementation of the amplifier system 100, the predetermined voltage level $V_{BAT}$ is provided by the power supply to the multilevel output stage 160 through the boost inductor $L_{BST}$, as described below in connection with FIGS. 6A-6B. Note that the boost capacitor $C_{BST1}$, the second boost capacitor $C_{BST2}$, the boost inductor $L_{BST}$ and the power supply can be connected to the multilevel output stage 160 in the foregoing manner during fabrication of the amplifier system 100, e.g., to satisfy specifications of a high-priced consumer electronics device in which this boosted amplifier system will be integrated.

Figure 1C:
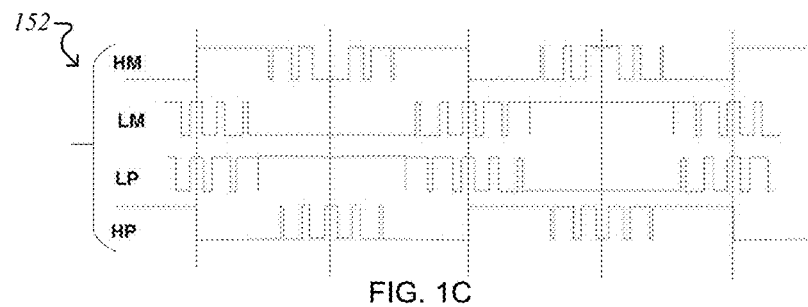
Figure 1B:
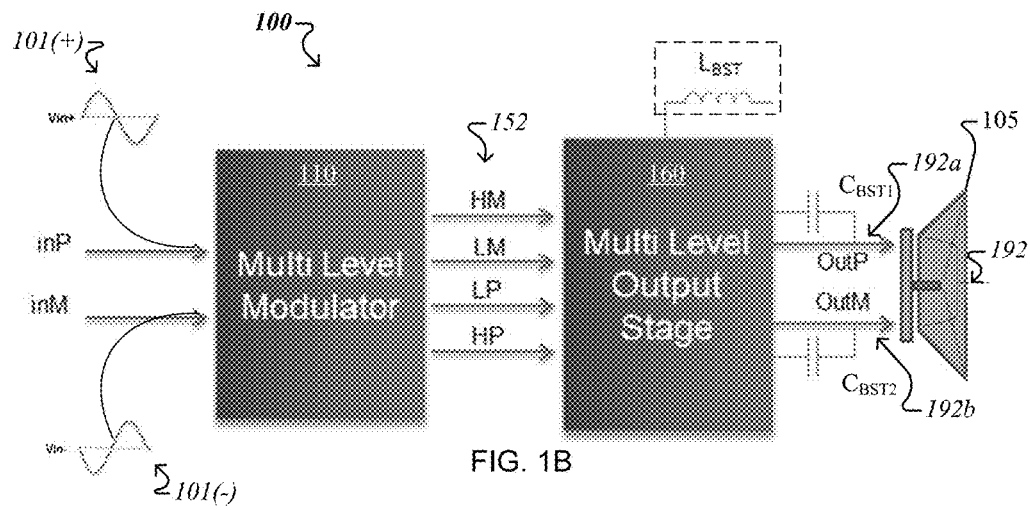

FIG. 1B shows an implementation of the amplifier system 100 in which the boost capacitor $C_{BST1}$ is connected to one output port (outP) of the amplifier system and second the boost capacitor $C_{BST2}$ is connected to the other output port (outM) of the amplifier system as described above for the double-boosted implementation or the highly boosted implementation of the amplifier system. In the example illustrated in FIG. 1B, a first instance 101(+) and a second instance 101(−) of the input analog signal is received by the amplifier system 100 through the input ports (inP, inM). Here, the input analog signal 101(+), 101(−) is an audio signal, and the load 105 coupled to the output ports (outP, outM) of the amplifier system 100 is a speaker.

The multilevel modulator 110 forms four pulse-width modulated (PWM) driving signals 152 (labeled HM, LM, LP, HP) by combining the input analog signal 101(+), 101(−) and an internal, square carrier signal. The formed PWM driving signals 152 (HM, LM, LP, HP) are indicative of the input analog signal 101(+), 101(−), as illustrated in FIG. 1C.

Figure 1D:
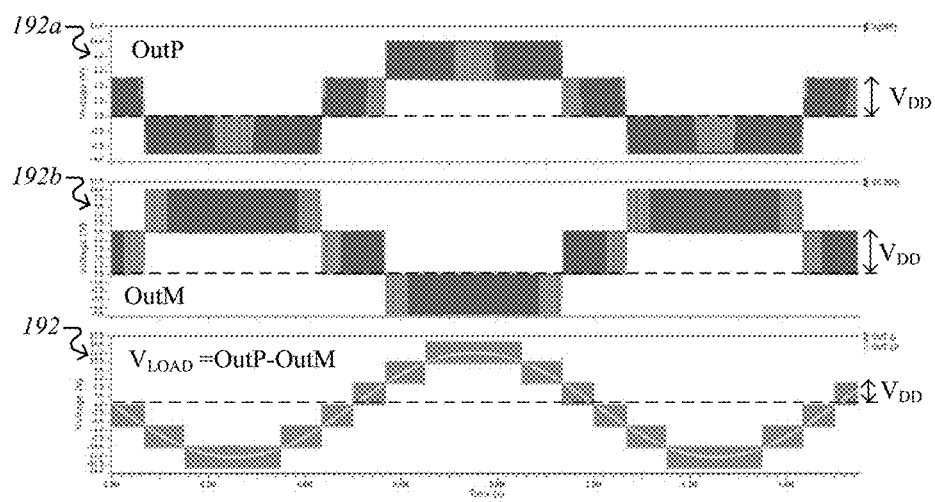

Referring again to FIG. 1B, the multilevel output stage 160 is driven by the four PWM driving signals 152 (HM, LM, LP, HP) and issues a first multilevel output signal 192a to one output port (outP) of the amplifier system 100 and a second multilevel output signal 192b to the other output port (outM) of the amplifier system. In this implementation, each of the multilevel output signals 192a, 192b issued respectively to the output ports (outP, outM) has a dynamic range of $[-V_{DD}, +2V_{DD}]$, that corresponds to a peak-to-peak swing of $3V_{DD}$, as shown in FIG. 1D. Moreover, differences between adjacent levels of each of the multilevel output signals 192a, 192b have a magnitude equal to $V_{DD}$. Note that $V_{DD}=V_{BAT}$ for the double boosted implementation of the amplifier system 100, when the power supply provides the predetermined voltage level $V_{BAT}$ directly to the multilevel output stage 160, and $V_{DD}=V_{BST}$ for the highly boosted implementation of the amplifier system 100, when the power supply provides the predetermined voltage level $V_{BAT}$ to the multilevel output stage through the boost inductor $L_{BST}$. For example, a value of the boosted voltage level is $V_{BST}$=5.5V.

An amplified signal 192, provided by the multilevel output stage 160 to the load 105 coupled to the outputs (outP, outM), is a difference between the multilevel output signals 192a, 192b. In this manner, the amplified signal 192 provided to the load 105 is a multilevel replica of the input signal and has an amplitude of $3V_{DD}$, that corresponds to a peak-to-peak swing of $6V_{DD}$, as shown in FIG. 1D. As in the case of the multilevel output signals 192a, 192b, differences between adjacent levels of the amplified signal 192 have a magnitude equal to $V_{DD}$ (where $V_{DD}=V_{BAT}$ or $V_{DD}=V_{BST}$).

Figure 2:
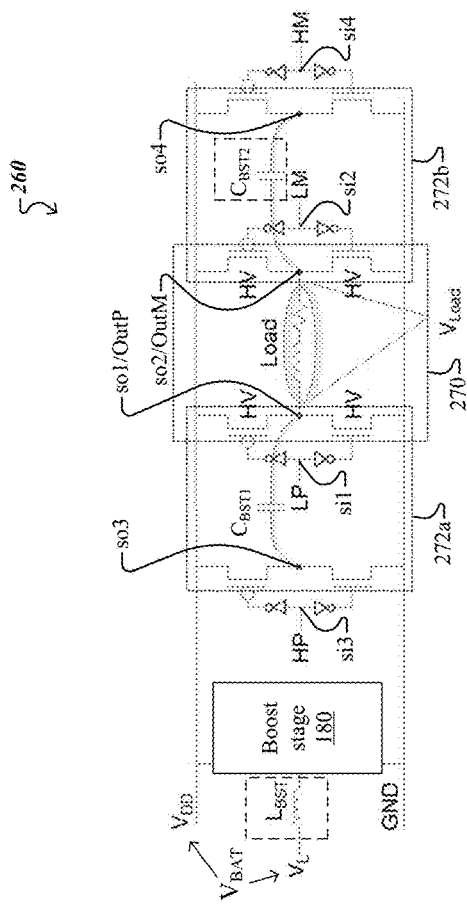
FIG. 2 shows aspects of a multilevel output stage that provides a multilevel output signal with an amplitude equal to a non-unity integer multiple of a power supply voltage.

FIG. 2 shows aspects of a multilevel output stage 260 that can provide to a load a multilevel amplified signal $V_{LOAD}$ with an amplitude equal to an integer multiple of a power supply voltage $V_{DD}$. The multilevel output stage 260 can be used as the multilevel output stage 160 of the multilevel class-D amplifier 100 shown in FIGS. 1A-1B. Note that the multilevel output stage 260 can be formed on an IC chip, e.g., on the IC chip 103 shown in FIG. 1A.

The multilevel output stage 260 includes four output stage input ports (si1, si3, si2, si4). When integrated in a multilevel class-D amplifier (like the one shown in FIGS. 1A-1B), the output stage input ports (si1, si3, si2, si4) are respectively coupled to modulator output ports of a multilevel modulator (e.g., the modulator output ports (mo1, mo2, mo3, mo4) of the multilevel modulator 110 shown in FIG. 1A) to receive respective driving PWM signals (LP, LM, HP, HM). Further, the multilevel output stage 260 includes four output stage boost ports (so1, so3, so2, so4).

The multilevel output stage 260 includes a first pair of high-voltage (HV) switches (e.g., high-voltage power MOSFETs arranged in a cascoded structure) connected to each other at a first one (so1) of the output stage boost ports (so1, so3, so2, so4). The first pair of HV switches is powered with a power supply voltage level $V_{DD}$ (relative to ground), and has a first control terminal coupled to a first one (si1) of the output stage input ports (si1, si3, si2, si4). Note that each of the HV switches of the first pair includes a gate terminal and the gate terminals are coupled with the first control terminal through logic circuitry. When the multilevel output stage 260 is used in the multilevel class-D amplifier 100, a first PWM driving signal LP is applied to the first output stage input port (si1), and the first output stage boost port (so1) is coupled to one output port (outP) of the multilevel class-D amplifier where one of two terminals of a load is connected. Additionally, the multilevel output stage 260 includes a second pair of HV switches connected to each other at a second one (so2) of the output stage boost ports (so1, so3, so2, so4). The second pair of HV switches also is powered with the power supply voltage level $V_{DD}$, and has a second control terminal coupled to a second one (si2) of the output stage input ports (si1, si3, si2, si4). Note that each of the HV switches of the second pair includes a gate terminal, and the gate terminals are coupled with the second control terminal through logic circuitry. When the multilevel output stage 260 is used in the multilevel class-D amplifier 100, a second PWM driving signal LM is applied to the second output stage input port (si2), and the second output stage boost port (so1) is coupled to the other output port (outM) of the multilevel class-D amplifier where the other one of the two terminals of the load is connected. In this manner, when the load is connected to the output ports (outP, outM), an output bridge 270 is formed that includes the first pair of HV switches, the second pair of HV switches and the load. Here, the output bridge 270 provides to the load the amplified signal $V_{LOAD}$.

Further, the multilevel output stage 260 includes a first pair of low-voltage (LV) switches (e.g., low-voltage MOSFETs arranged in a cascoded complementary metal-oxide semiconductor (CMOS) structure) connected to each other at a third one (so3) of the output stage boost ports (so1, so3, so2, so4). The first pair of LV switches also is powered with the power supply voltage level $V_{DD}$, and has a third control terminal coupled to a third one (si3) of the output stage input ports (si1, si3, si2, si4). Note that each of the LV switches of the first pair includes a gate terminal and the gate terminals are coupled with the third control terminal through logic circuitry. When the multilevel output stage 260 is used in the multilevel class-D amplifier 100, a third PWM driving signal HP is applied to the third output stage input port (si3). Furthermore, the multilevel output stage 260 includes a second pair of LV switches connected to each other at a fourth one (so4) of the output stage boost ports (so1, so3, so2, so4). The second pair of LV switches also is powered with the power supply voltage level $V_{DD}$, and has a fourth control terminal coupled to a fourth one (si4) of the output stage input ports (si1, si3, si2, si4). Note that each of the LV switches of the fourth pair includes a gate terminal, and the gate terminals are coupled with the fourth control terminal through logic circuitry. When the multilevel output stage 260 is used in the multilevel class-D amplifier 100, a fourth PWM driving signal HM is applied to the fourth output stage input port (si4).

Moreover, the multilevel output stage 260 includes a boost stage 180. If the boost stage 180 is powered with a voltage level $V_L$ through a boost inductor $L_{BST}$, which is external to the multilevel output stage, then the boost stage outputs the power supply voltage level $V_{DD}=V_{BST}$ (relative to ground). For example, a battery is used to provide the voltage level $V_L$, such that $V_L=V_{BAT}<V_{BST}$. Else, if the boost stage 180 is not powered, i.e., a boost inductor $L_{BST}$ is not connected between the battery and the boost stage 180, then the battery is connected directly to the multilevel output stage 260 (not via the boost inductor $L_{BST}$) and provides the power supply voltage level $V_{DD}=V_{BAT}$ (relative to ground).

Figure 3A:
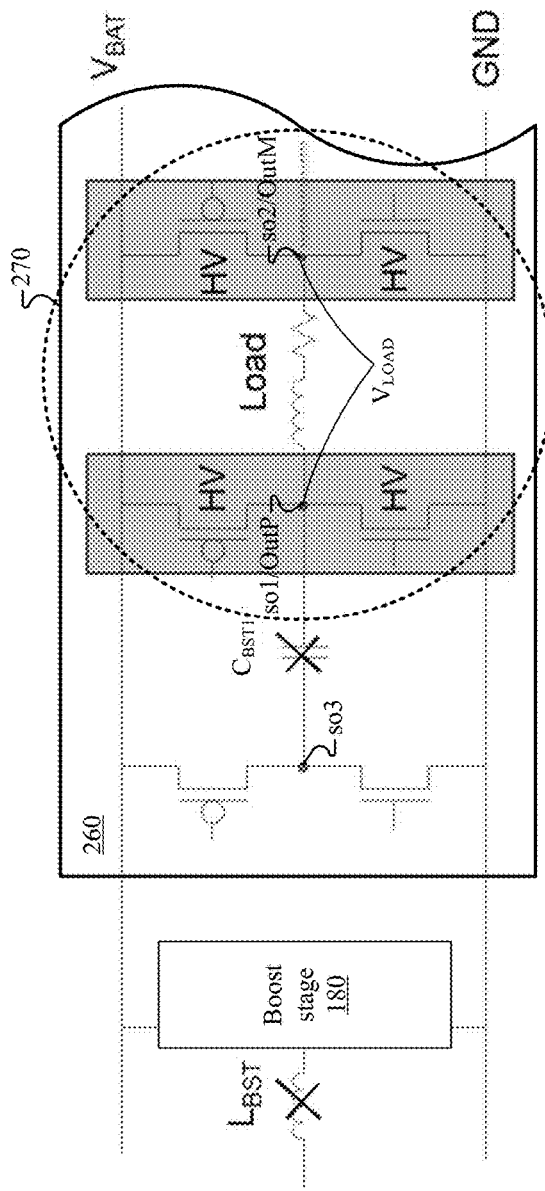
FIGS. 3A-3B show aspects of a multilevel output stage that provides an output signal with an amplitude equal to a power supply voltage.
Figure 3B:
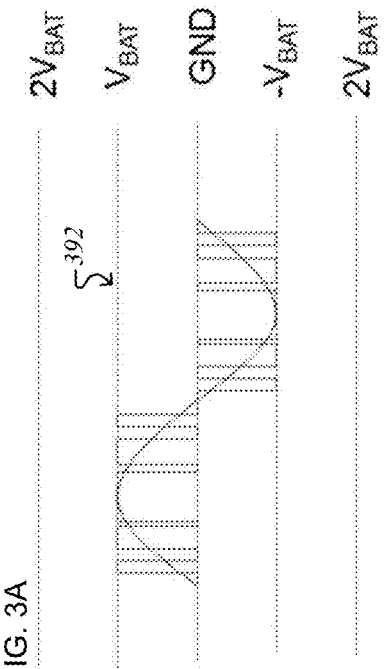

The multilevel output stage 260 can be integrated in the amplifier system 100, as is, i.e., without connecting one or two boost capacitors $C_{BST1}$, $C_{BST2}$ to select pairs of the output stage boost ports (so1, so3, so2, so4), and without connecting the boost inductor $L_{BST}$ to the boost stage 180. This case is illustrated in FIG. 3A, where $L_{BST}$=N/A, $V_L$=N/A, $C_{BST1}$=N/A, $C_{BST2}$=N/A and the power supply voltage level is $V_{DD}=V_{BAT}$. Here, PWM driving signals (LP, LM, HP, HM) are applied to respective output stage input ports (si1, si3, si2, si4). FIG. 3B shows a graph 392 of an amplified signal $V_{LOAD}$ provided to the load at the output ports (outP, outM) of the output bridge 270. In this case, an amplitude of the amplified signal $V_{LOAD}$ is equal to the power supply voltage level $V_{BAT}$, e.g., amplitude($V_{LOAD}$)=3.7V.

Figure 4A:
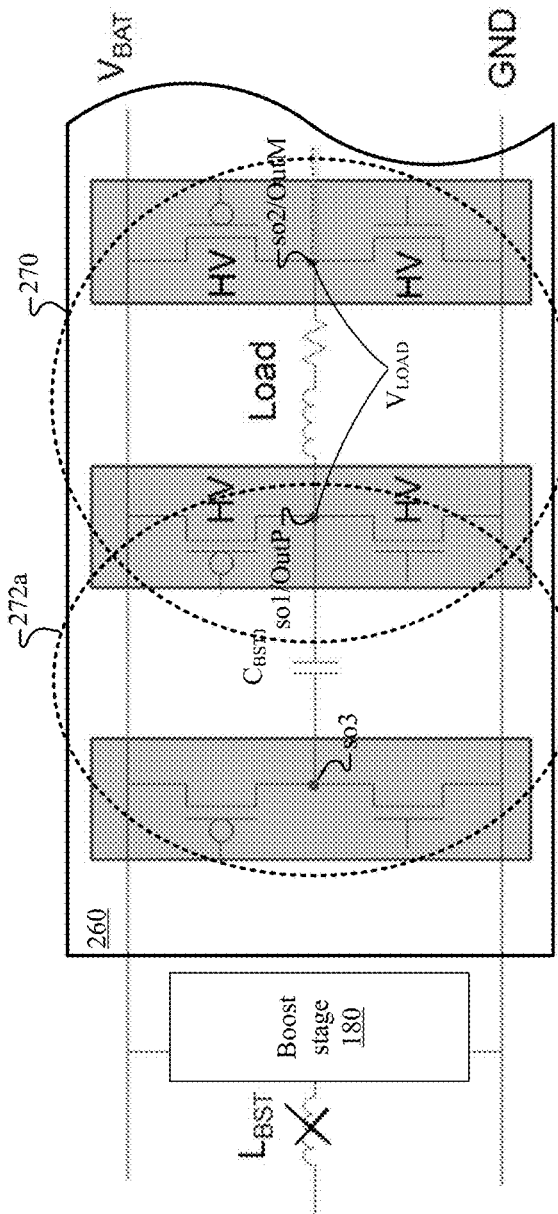
FIGS. 4A-4B show aspects of a multilevel output stage that provides a multilevel output signal with an amplitude equal to twice a power supply voltage.
Figure 4B:
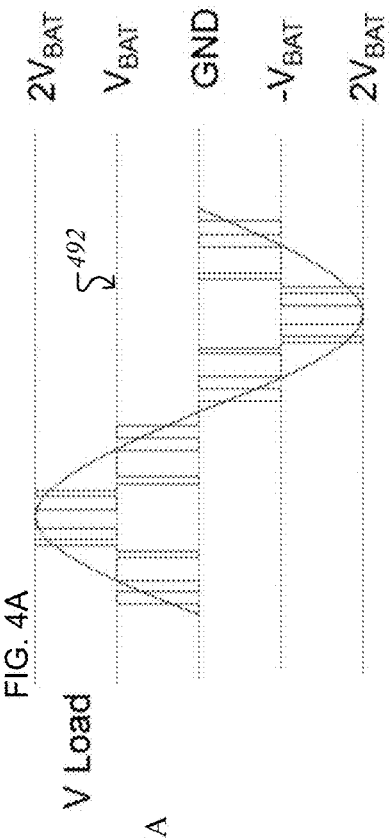

Referring again to FIG. 2, one or two boost capacitors $C_{BST1}$, $C_{BST2}$, that are external to the multilevel output stage 260, can be connected to select pairs of the output stage boost ports (so1, so3, so2, so4), and the boost inductor $L_{BST}$ can be connected to the boost stage 180, when the multilevel output stage 260 is integrated in the amplifier system 100. In a first example, a boost capacitor $C_{BST1}$ is coupled between the third output stage input port (si3) and the first output stage input port (si1/outP) to form a boost bridge 272a that includes the first pair of HV switches, the first pair of LV switches and the boost capacitor $C_{BST1}$. This case is illustrated in FIG. 4A, where $L_{BST}$=N/A, $V_L$=N/A, $C_{BST2}$=N/A and the power supply voltage level is $V_{DD}=V_{BAT}$. Here, PWM driving signals (LP, LM, HP, HM) are applied to respective output stage input ports (si1, si3, si2, si4), and a value of 10 μF can be chosen for the boost capacitor $C_{BST1}$ of the boost bridge 272a, for instance. FIG. 4B shows a graph 492 of a multilevel amplified signal $V_{LOAD}$ provided to the load by the output bridge 270 at the output ports (outP, outM). In this case, an amplitude of the amplified signal $V_{LOAD}$ is equal to twice the power supply voltage level $2V_{BAT}$, e.g., amplitude($V_{LOAD}$)=3.7+3.7=7.4V, while differences between adjacent levels of the multilevel amplified signal $V_{LOAD}$ have a magnitude equal to the power supply voltage level $V_{BAT}$. The increase from $V_{BAT}$ to $2V_{BAT}$ of the amplitude of the multilevel amplified signal $V_{LOAD}$ provided to the load at the output ports (outP, outM) of the output bridge 270 is caused by charging and discharging of the boost capacitor $C_{BST1}$ of the boost bridge 272a.

Referring again to FIG. 2, as a second example, a first boost capacitor $C_{BST1}$ is coupled between the third output stage input port (si3) and the first output stage input port (si1/outP) to form a first boost bridge 272a that includes the first pair of HV switches, the first pair of LV switches and the first boost capacitor $C_{BST1}$. And a second boost capacitor $C_{BST2}$ is coupled between the fourth output stage input port (si4) and the second output stage input port (si2/outM) to form a second boost bridge 272b that includes the second pair of HV switches, the second pair of LV switches and the second boost capacitor $C_{BST2}$. This case is illustrated in FIG. 5A, where $L_{BST}$=N/A, $V_L$=N/A and the power supply voltage level is $V_{DD}=V_{BAT}$. Here, PWM driving signals (LP, LM, HP, HM) are applied to respective output stage input ports (si1, si3, si2, si4), and a value of 10 μF can be chosen for both the first boost capacitor $C_{BST1}$ of the first boost bridge 272a and the second boost capacitor $C_{BST2}$ of the second boost bridge 272b, for instance. FIG. 5B shows a graph 592 of a multilevel amplified signal $V_{LOAD}$ provided to the load by the output bridge 270 at the output ports (outP, outM). In this case, an amplitude of the amplified signal $V_{LOAD}$ is equal to three times the power supply voltage level $3V_{BAT}$, e.g., amplitude($V_{LOAD}$)=3.7+3.7+3.7=11.1V, while differences between adjacent levels of the multilevel amplified signal $V_{LOAD}$ have a magnitude equal to the power supply voltage level $V_{BAT}$. The increase from $2V_{BAT}$ To $3V_{BAT}$ of the amplitude of the multilevel amplified signal $V_{LOAD}$ provided to the load at the output ports (outP, outM) of the output bridge 270 is caused by charging and discharging of both the first boost capacitor $C_{BST1}$ of the first boost bridge 272a and the second boost capacitor $C_{BST2}$ of the second boost bridge 272b.

Referring again to FIG. 2, as a third example, a first boost capacitor $C_{BST1}$ is coupled between the third output stage input port (si3) and the first output stage input port (si1/outP) to form a first boost bridge 272a that includes the first pair of HV switches, the first pair of LV switches and the first boost capacitor $C_{BST1}$. Further, a second boost capacitor $C_{BST2}$ is coupled between the fourth output stage input port (si4) and the second output stage input port (si2/outM) to form a second boost bridge 272b that includes the second pair of HV switches, the second pair of LV switches and the second boost capacitor $C_{BST2}$. Furthermore, a boost inductor $L_{BST}$ is coupled between a battery that outputs a voltage level $V_{BAT}$ and an input of the boost stage 180. This case is illustrated in FIG. 6A, where the voltage level $V_L$ used to power the boost stage 180 through the boost inductor $L_{BST}$ is $V_L=V_{BAT}$, which causes for the power supply voltage level $V_{DD}$ to be equal to a boosted voltage level $V_{BST}$ output by the boost stage 180: $V_{DD}=V_{BST}$. Here, PWM driving signals (LP, LM, HP, HM) are applied to respective output stage input ports (si1, si3, si2, si4). Moreover, a value of 10 µF can be chosen for both the first boost capacitor $C_{BST1}$ of the first boost bridge 272a and the second boost capacitor $C_{BST2}$ of the second boost bridge 272b, and a value of 2 µH can be chosen for the boost inductance $L_{BST}$, for instance. FIG. 6B shows a graph 692 of a multilevel amplified signal $V_{LOAD}$ provided to the load by the output bridge 270 at the output ports (outP, outM). In this case, an amplitude of the amplified signal $V_{LOAD}$ is equal to three times the power supply voltage level $3V_{BST}$, e.g., amplitude($V_{LOAD}$)=5.5+5.5+5.5=16.5V, while differences between adjacent levels of the multilevel amplified signal $V_{LOAD}$ have a magnitude equal to the power supply voltage level $V_{BST}$. Once again, the increase from $2V_{BST}$ to $3V_{BST}$ of the amplitude of the multilevel amplified signal $V_{LOAD}$ provided to the load at the output ports (outP, outM) of the output bridge 270 is caused by charging and discharging of both the first boost capacitor $C_{BST1}$ of the first boost bridge 272a and the second boost capacitor $C_{BST2}$ of the second boost bridge 272b. Connecting the boost inductor $L_{BST}$ to the boost stage 180 of the multilevel output stage 260, for the example illustrated in FIG. 6A, causes not only an increase of the amplitude of the amplified signal $V_{LOAD}$ from 11.1V to 15.5V compared to the example shown in FIG. 5A, but also ensures that the amplitude $3V_{BST}$ of the amplified signal $V_{LOAD}$ is independent from the state of charge of the battery. In contrast, the amplitude $3V_{BAT}$ of the amplified signal $V_{LOAD}$ for the double boosted implementation of the multilevel output state 260, illustrated in FIG. 5A, can decrease along with the voltage level $V_{BAT}$ when the charge of the battery decreases.

Figure 7:
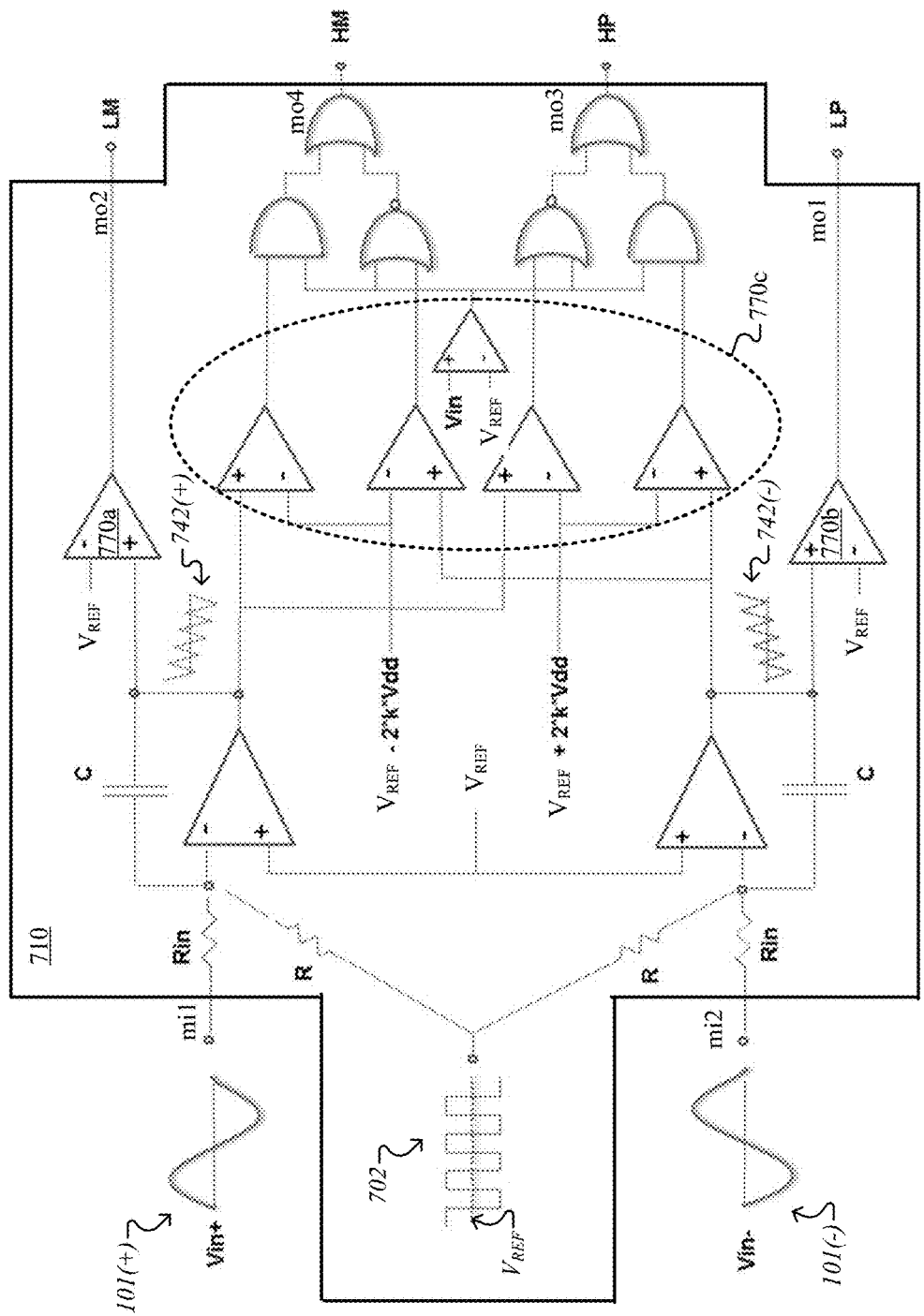
FIG. 7 shows an example of a multilevel modulator.

FIG. 7 shows an example of a multilevel modulator 710. The multilevel modulator 710 can be used as the multilevel modulator 110 of the multilevel class-D amplifier 100 shown in FIGS. 1A-1B. Note that the multilevel modulator 710 can be formed on an IC chip, e.g., on the IC chip 103 shown in FIG. 1A.

The multilevel modulator 710 includes a pair of modulator input ports (mi1, mi2). When used in the amplifier system 100 shown in FIG. 1A, the modulator input ports (mi1, mi2) are respectively coupled to the input ports (inP, inM) of the amplifier system to receive a first instance 101(+) and a second instance 101(−) of an input analog signal. Note that in the configurations shown in FIGS. 1A-1B and 7, the input analog signal is received by the multilevel modulator 710 as an input differential signal. Additionally, the multilevel modulator 110 includes four modulator output ports (mo1, mo2, mo3, mo4). When used in the amplifier system 100 shown in FIG. 1A, the modulator output ports (mo1, mo2, mo3, mo4) are respectively coupled with the output stage input ports (si1, si3, si2, si4) of the multilevel output stage 160. The multilevel modulator 710 forms four PWM signals (LP, LM, HP, HM) by combining the input differential signal 101(+), 101(−) with a square carrier signal 702 generated internally to the multilevel modulator. When used in the amplifier system 100 shown in FIG. 1A, the formed PWM signals (LP, LM, HP, HM)—issued at the respective modulator output ports (mo1, mo2, mo3, mo4)—are used to drive the multilevel output stage 160.

The multilevel modulator 710 is arranged and configured as a fully differential integrator. When no input differential signal 101(+), 101(−) is received by the multilevel modulator 710, the fully differential integrator integrates only the carrier square wave 702 to obtain a triangular wave centered on a reference voltage $V_{REF}$. Comparison of the obtained triangular wave (centered on the reference voltage $V_{REF}$) to the reference voltage $V_{REF}$ results in a PWM signal with 50% duty cycle. If an input differential signal 101(+), 101(−) is received by the multilevel modulator 710, then the fully differential integrator integrates a combination of the input differential signal and the carrier square wave 702 to obtain two triangular waves 742(+), 742(−) (having opposing signs), where the obtained triangular waves are indicative of the received input differential signal.

Figure 8:
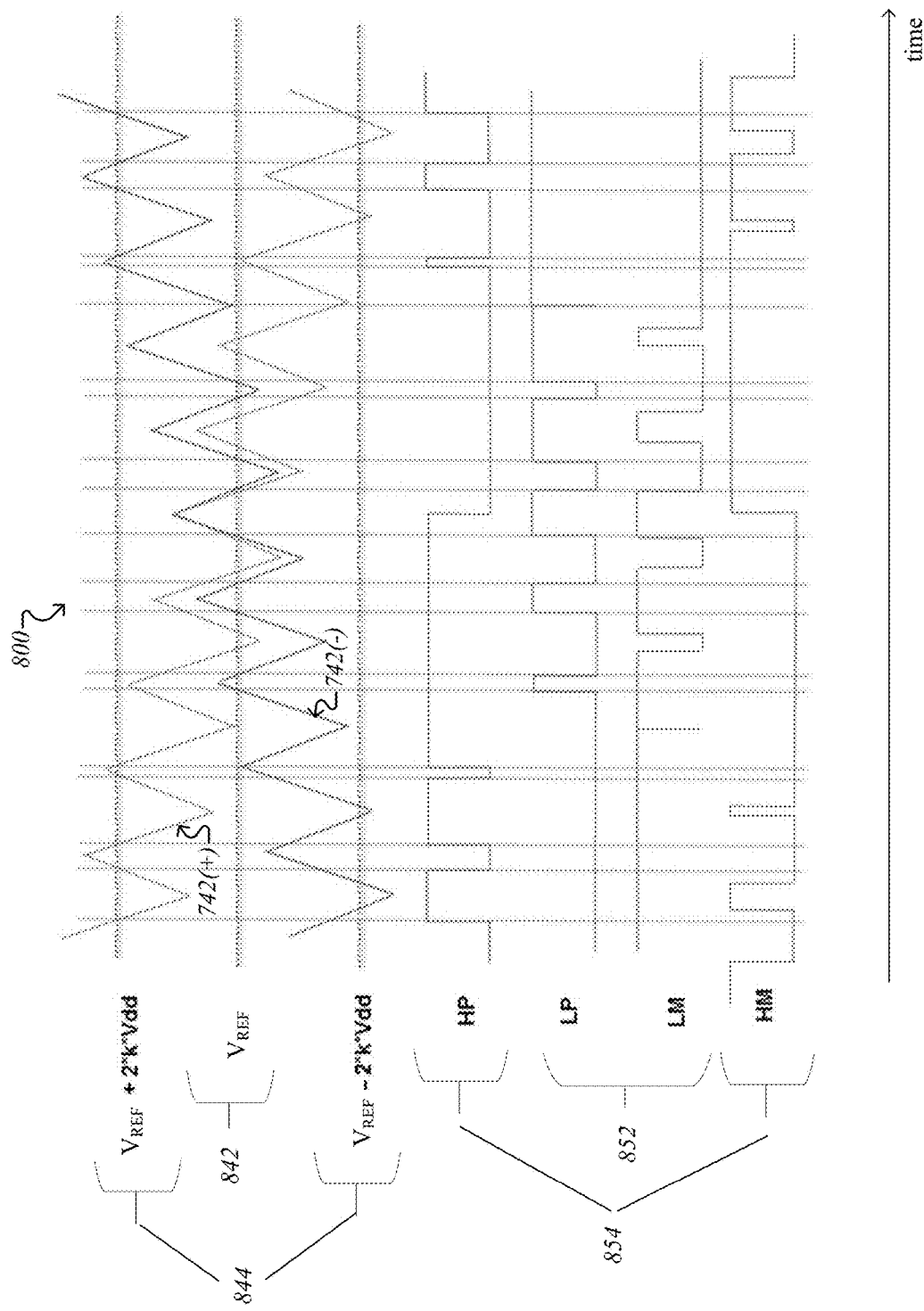
FIG. 8 shows aspects of signals formed inside, and aspects of pulse-width modulated (PWM) driving signals output by, the multilevel modulator from FIG. 7.

Comparators 770a, 770b of the multilevel modulator 710 perform comparisons of the obtained triangular waves 742(+), 742(−) to the reference voltage $V_{REF}$, as shown in FIG. 8, in portion 842 of graph 800. The multilevel modulator 710 generates, based on results of the comparisons, respective PWM signals (LP, LM) having differential (opposite in time) duty cycles, as shown in FIG. 8, in portion 852 of graph 800. Referring again to FIG. 7, the generated PWM signals (LP, LM) are output at respective first and second modulator output ports (mo1, mo2) of the multilevel modulator 710. When the multilevel modulator 710 is part of an amplifier system 100 that includes a multilevel output stage 260, the PWM signals (LP, LM) are used to respectively drive the first pair of HV switches and the second pair of HV switches of the multilevel output stage, when the multilevel output signals 192a, 192b—respectively issued by the first pair of HV switches and the second pair of HV switches—swing from ground to $V_{DD}$, where $V_{DD}$ can be $V_{BAT}$ or $V_{BST}$, as described above in connection with FIGS. 5A and 6A.

However, if the triangular waves 742(+), 742(−) output by the differential integrator exceed a threshold of the comparators 770a, 770b, then the combination of comparators 770c of the multilevel modulator 710 starts comparing each of the triangular waves 742(+), 742(−) with two additional reference voltages $V_{REF}+2\,kV_{DD}$ and $V_{REF}-2\,kV_{DD}$. Corresponding comparisons of the triangular waves 742(+), 742(−) to the noted additional reference voltages $V_{REF}\pm2\,kV_{DD}$ are shown in FIG. 8, in portion 844 of graph 800. The multilevel modulator 710 generates, based on results of the comparisons, respective PWM signals (HP, HM) having differential (opposite in time) duty cycles, as shown in FIG. 8, in portion 854 of graph 800. Referring again to FIG. 7, the generated PWM signals (HP, HM) are output at respective third and fourth modulator output ports (mo3, mo4) of the multilevel modulator 710.

When the multilevel modulator 710 is part of an amplifier system 100 that includes a multilevel output stage 260, the PWM signals (HP, HM) are used to respectively drive the first pair of LV switches and the second pair of LV switches of the multilevel output stage, such that if the multilevel output signals 192a, 192b—respectively issued by the first pair of HV switches and the second pair of HV switches— swing (i) from $V_{DD}$ to $2V_{DD}$, then the gates of the cascoded MOSFETs of each of the first pair of LV switches and the second pair of LV switches are connected to $V_{DD}$, or (ii) from ground to $-V_{DD}$, then the gates of the cascoded MOSFETs of each of the first pair of LV switches and the second pair of LV switches are connected to ground. In this manner, each of the first pair of HV switches and the second pair of HV switches can safely issue respective multilevel output signals 192a, 192b that swing between $+2V_{DD}$ and $-V_{DD}$, as shown above in graphs 192a, 192b, without causing damage to the power MOSFETs included therein.

Note that the described class-D amplifier can transfer power more efficiently to a load than the conventional charge-pump implementation of the class-D amplifier shown in FIG. 9A, because the multilevel output stage 260 has smaller output resistance $R_{OUT}$ than the output resistance $R_{OUT,CP}$ of the single-level output stage shown in FIG. 9A. Charge-pump circuitry includes four switches (e.g., MOSFETs) in a bridge configuration with the fly capacitor $C_{Fly}$, and the switches of the charge-pump circuitry are always ON, hence, a contribution of the charge-pump circuitry to $R_{OUT,CP}$ is a resistance $4R_{ON}$. Here, $R_{ON}$ is the series resistance of a single MOSFET in its ON state. Further, as two diagonally arranged switches of the output bridge of the conventional charge-pump implementation of the class-D amplifier are alternately always on, the contribution of the output bridge to $R_{OUT,CP}$ is a resistance $2R_{ON}$. Thus, the total output resistance $R_{OUT,CP}$ of the single-level output stage of the conventional charge-pump implementation of the class-D amplifier shown in FIG. 9A is $R_{OUT,CP}=6R_{ON}$.

In contrast, the contribution to the output resistance $R_{OUT}$ of the multilevel output stage 260 (as shown, e.g., in FIG. 2 or FIG. 6A) varies based on an amplitude of the amplified signal $V_{LOAD}$ output at the output ports (outP, outM). When the amplified signal amplitude is between zero and $V_{BAT}$, the output resistance of the multilevel output stage 260 is $R_{OUT}(0, V_{BAT})=2R_{ON}$ because two diagonally arranged HV switches of the output bridge 270 are ON (to provide current to the load) and contribute a resistance $2R_{ON}$ to the output resistance $R_{OUT}$. Further, when the amplified signal amplitude is between $V_{BAT}$ and $2V_{BAT}$, the output resistance of the multilevel output stage 260 is $R_{OUT}(V_{BAT},2V_{BAT})=4R_{ON}$ because (i) two diagonally arranged switches of the first boost bridge 272a are ON (to charge the first boost capacitor $C_{BST1}$ of the first boost bridge) and contribute a resistance $2R_{ON}$ to the output resistance $R_{OUT}$, and (ii) two other switches diagonally arranged relative to the first boost capacitor $C_{BST1}$ and load are ON (to deliver charge from the first boost capacitor $C_{BST1}$ to the load) and contribute an additional resistance of $2R_{ON}$ to the output resistance $R_{OUT}$. Furthermore, when the amplified signal amplitude is between $2V_{BAT}$ and $3V_{BAT}$, the output resistance of the multilevel output stage 260 is $R_{OUT}(2V_{BAT},3V_{BAT})=6R_{ON}$ because (i) two diagonally arranged switches of the first boost bridge 272a are ON (to charge the first boost capacitor $C_{BST1}$ of the first boost bridge) and contribute a resistance $2R_{ON}$ to the output resistance $R_{OUT}$, (ii) two diagonally arranged switches of the second boost bridge 272b are ON (to charge the second boost capacitor $C_{BST2}$ of the second boost bridge) and contribute a resistance $2R_{ON}$ to the output resistance $R_{OUT}$, and (iii) two other switches diagonally arranged relative to the first boost capacitor $C_{BST1}$, load and second boost capacitor $C_{BST2}$ are ON (to deliver charge from the first boost capacitor and the second boost capacitor to the load) and contribute an additional resistance of $2R_{ON}$ to the output resistance $R_{OUT}$. In this manner, the output resistance of the multilevel output stage 260 over all amplified signal amplitudes, from zero to $3V_{BAT}$, is a weighted average:

$$R_{OUT} = w_1 * R_{OUT}(0, V_{BAT}) + w_2 * R_{OUT}(V_{BAT}, 2V_{BAT}) + \quad (1)$$
$$w_3 * R_{OUT}(2V_{BAT}, 3V_{BAT})$$
$$= w_1 * 2R_{ON} + w_2 * 4R_{ON} + w_3 * 6R_{ON}$$
$$= (2w_1 + 4w_2 + 6w_3)R_{ON}.$$

The weights $w_1$, $w_2$, $w_3$ are proportional to the amount of time that the amplitude of the amplified signal is in respective ranges $(0;V_{BAT}]$, $(V_{BAT},2V_{BAT}]$, $(2V_{BAT},3V_{BAT}]$, and thus they are finite (non-zero), $w_1>0$, $w_2>0$, $w_3>0$, and they add to 1: $w_1+w_2+w_3=1$. Because the foregoing weighted average $R_{OUT}$ is necessarily smaller than $6R_{ON}$, the multilevel output stage 260 has smaller output resistance $R_{OUT}$ than the output resistance $R_{OUT,CP}=6R_{ON}$ of the single-level output stage of the conventional charge-pump implementation of the class-D amplifier shown in FIG. 9A. For example, an amplified audio signal may have an amplitude less than $V_{BAT}$ for a portion of 90% of the total signal duration, thus, in this case, the multilevel output stage 260 has an output resistance $R_{OUT}=2R_{ON}$ for 90% of the total signal duration, while the single-level output stage of the conventional charge-pump implementation of the class-D amplifier shown in FIG. 9A has an output resistance $R_{OUT,CP}=6R_{ON}$ for the entire signal duration.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SoC) implementations, which can include one or more controllers and embedded code.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An amplifier system for amplifying an input signal that varies over time, the amplifier system comprising:
   a multilevel output stage powered with a voltage having a predetermined voltage level relative to ground;
   a multilevel modulator configured to
      form a plurality of pulse-width modulated (PWM) driving signals based on i) the input signal and ii) a square carrier signal, and
      drive the multilevel output stage with the plurality of PWM driving signals;
   a pair of output ports coupled with the multilevel output stage; and
   a boost capacitor having two terminals, one of the two terminals being coupled with a first output port of the pair of output ports,
   wherein the multilevel output stage is configured to output, at the pair of output ports, when driven with the plurality of PWM driving signals, an output signal having a plurality of levels,
   wherein differences between adjacent levels of the output signal have a magnitude equal to the predetermined voltage level,
   wherein an amplitude of the output signal is a non-unity integer multiple of the predetermined voltage level,
   wherein the output signal varies over time between its multiple levels in accordance with the input signal, and
   wherein the multilevel output stage comprises
      four high-voltage (HV) switches, that form, when a load is coupled between the pair of output ports, an output bridge that includes the four HV switches and the load; and
      a boost bridge that includes
         a pair of the HV switches,
         a pair of low-voltage (LV) switches, and
         the boost capacitor,
         wherein the pair of the HV switches are coupled with each other and with the one of the two terminals of the boost capacitor at the first output port,
         wherein the pair of LV switches are coupled with each other and with another one of the two terminals of the boost capacitor, and
         wherein the boost bridge is driven by a pair of PWM driving signals of the plurality of PWM driving signals.

2. The amplifier system of claim 1, wherein the amplitude of the output signal is twice the predetermined voltage level.

3. The amplifier system of claim 1, wherein the multilevel output stage further comprises
   a second boost capacitor having two terminals, one of the two terminals being coupled with a second output port of the pair of output ports; and
   a second boost bridge that includes
      a second pair of the HV switches,
      a second pair of LV switches, and
      the second boost capacitor,
      wherein the second pair of the HV switches are coupled with each other and with the one of the terminals of the second boost capacitor at the second output port,
      wherein the second pair of LV switches are coupled with each other and with another one of the terminals of the second boost capacitor, and
      wherein the second boost bridge is driven by a second pair of PWM driving signals of the plurality of PWM driving signals.

4. The amplifier system of claim 3, wherein the amplitude of the output signal is three times the predetermined voltage level.

5. The amplifier system of claim 3, comprising a power supply that provides the predetermined voltage level to the multilevel output stage.

6. The amplifier system of claim 3, wherein
   the multilevel output stage further comprises a boost stage, and
   the amplifier system comprises a power supply that
      powers the boost stage through a boost inductor with a power supply voltage level smaller than the predetermined voltage level, and
      causes the boost stage to provide the predetermined voltage level to the first and second boost bridges.

7. The amplifier system of claim 1, wherein the multilevel modulator comprises a fully differential integrator.

8. The amplifier system of claim 7, wherein the multilevel modulator comprises a differential input to receive the input signal.

9. The amplifier system of claim 8, wherein the multilevel modulator comprises four outputs through which respective four PWM driving signals are delivered to the multilevel output stage.

10. An amplification system comprising:
   an integrated circuit chip comprising amplifier circuitry, the amplifier circuitry comprising
      a multilevel modulator including
         two modulator input ports, and
         four modulator output ports; and
      a multilevel output stage including
         four output stage input ports respectively coupled with the four modulator output ports,
         four output stage boost ports,
         a first pair of high-voltage (HV) switches connected to each other at a first one of the output stage boost ports, the first pair of HV switches having a first control terminal coupled to a first one of the output stage input ports,
         a second pair of HV switches connected to each other at a second one of the output stage boost ports, the second pair of HV switches having a second control terminal coupled to a second one of the output stage input ports,
         a first pair of low-voltage (LV) switches connected to each other at a third one of the output stage boost ports, the first pair of LV switches having a third control terminal coupled to a third one of the output stage input ports, and
         a second pair of LV switches connected to each other at a fourth one of the output stage boost ports, the second pair of LV switches having a fourth control terminal coupled to a fourth one of the output stage input ports;
   two amplifier input ports respectively coupled with the modulator input ports;
   two amplifier output ports respectively coupled with the first output stage boost port and the second output stage boost port, wherein, during operation of the amplifier system, a load coupled between the two amplifier output ports causes formation of an output bridge that includes the first pair of HV switches, the second pair of HV switches and the load; and a boost capacitor having two terminals, one of the two terminals being coupled to the first output stage boost port, and another of the two terminals being coupled to the third output stage boost port, thereby forming a boost bridge that includes the first pair of HV switches, the first pair of LV switches and the boost capacitor.

11. The amplification system of claim 10, comprising:

a second boost capacitor having two terminals, one of the two terminals of the second boost capacitor being coupled to the second output stage boost port and at the other one of the terminals of the second boost capacitor being coupled to the fourth output stage boost port, thereby forming a second boost bridge that includes the second pair of HV switches, the second pair of LV switches and the second boost capacitor.

12. The amplification system of claim 11, comprising a power supply to power the multilevel output stage with a predetermined voltage level.

13. The amplification system of claim 11, wherein the multilevel output stage comprises a boost stage including a boost stage input and a boost stage output, the amplification system further comprises:

a boost inductor coupled with the boost stage input; and a power supply to power the boost stage through the boost inductor with a power supply voltage level, the boost stage to power the multilevel output stage with a predetermined voltage level that is boosted relative to the power supply voltage level.

14. The amplification system of claim 10, wherein the multilevel modulator comprises a fully differential integrator.

15. The amplification system of claim 14, wherein the multilevel modulator is configured to perform, during operation of the integrated circuit chip comprising amplifier circuitry, operations comprising:

receive an input signal through the modulator input ports, form four pulse-width modulated (PWM) drive signals based on (i) the input signal and (ii) a square carrier signal, and provide the four PWM drive signals, through respective modulator output ports to respective output stage input ports, to drive the output stage.

\* \* \* \* \*